United States Patent [19]

Sokoloff

[11] Patent Number: 4,559,498

[45] Date of Patent: Dec. 17, 1985

[54] SYMMETRICAL INTEGRATOR AND APPLICATION OF SAID INTEGRATOR TO AN ELECTRIC FILTER

[75] Inventor: Boris Sokoloff, Grenoble, France

[73] Assignee: Societe pour l'Etude et la Fabrication de Circuites Integres Speciaux E.F.C.I.S., Grenoble, France

[21] Appl. No.: 422,391

[22] Filed: Sep. 24, 1982

[30] Foreign Application Priority Data

Oct. 2, 1981 [FR] France ............................... 81 18637

[51] Int. Cl.[4] .......................................... G06G 7/186
[52] U.S. Cl. .................... 328/127; 307/520; 307/491; 333/19; 333/173; 330/107; 328/167
[58] Field of Search ............... 328/127, 138, 151, 150, 328/165, 167; 307/497, 520, 521, 525, 355, 356; 330/9, 107, 260; 333/173

[56] References Cited

U.S. PATENT DOCUMENTS

| | | | |
|---|---|---|---|
| 3,614,633 | 10/1971 | Yalyshev et al. | 330/107 |
| 3,895,309 | 7/1975 | Rollett et al. | 330/107 |
| 4,211,939 | 7/1980 | Furman | 328/127 |
| 4,278,943 | 7/1981 | Masuda et al. | 328/127 |
| 4,356,451 | 10/1982 | Wilson | 330/107 |
| 4,375,625 | 3/1983 | Lee | 330/107 |
| 4,400,637 | 8/1983 | Klar et al. | 328/127 |
| 4,405,899 | 9/1983 | Wurzborg | 330/107 |
| 4,446,438 | 5/1984 | Chang et al. | 307/494 |
| 4,450,368 | 5/1984 | Spence | 307/497 |

OTHER PUBLICATIONS

*IEEE Transactions on Circuits & Systems*, vol. CAS-27, No. 6, Jun. 1980, IEEE (New York), G. Szentirmai et al.: "Switched-Capacitor Building Blocks," pp. 492-501.

*Microelectronics Journal*, vol. 11, No. Mar.-Apr. 1980, MacKintosh Publications Ltd., (Luton, GB), R. Gregorian: "Filtering Techniques with Switched-Capacitor Circuits", pp. 13-21.

*IEEE Journal of Solid-State Circuits*, vol. SC-15, No. 3, Jun. 1980, IEEE (New York), G. C. Temes: "Finite Amplifier Gain and Bandwidth Effects in Switched-Capacitor Filters", pp. 358-361.

*Electronics Letters*, vol. 14, No. 12, Jun. 8, 1978, Hitchin Herts GB, G. C. Temes: "The Derivation of Switched-Capacitor Filters from Active RC Prototypes", pp. 361-362.

*Elektrotechnik und Maschinenbau*, vol. 97, No. 10, Oct. 1980, (Vienne), H. Weinrichter: "Schalter-Kondensator-Filter: ein neuer Weg zur Filterintegration", pp. 417-422.

*Primary Examiner*—Stanley D. Miller
*Assistant Examiner*—Timothy P. Callahan
*Attorney, Agent, or Firm*—Roland Plottel

[57] ABSTRACT

The symmetrical integrator comprises an operational amplifier having two floating inputs and two floating outputs each having a feedback connection to an input via a capacitor. An input capacitor is connected via two MOS transistors to two differential inputs of the integrator or via two additional MOS transistors to the inputs of the operational amplifier. The transfer function of the circuit is a pure integral or a sum of integrals if several input signals are applied to similar pairs of inputs. The integrator permits realization of filters whose transfer function has transmission zeros by utilizing additional inputs together with a direct capacitive coupling.

5 Claims, 5 Drawing Figures

SYMMETRICAL INTEGRATOR AND APPLICATION OF SAID INTEGRATOR TO AN ELECTRIC FILTER

This invention relates to the field of analog filtering and is directed to the realization of symmetrical filters which make use of symmetrical amplifiers.

One of the essential components of filters is the integrator element which had in most cases been realized up to the present time by an operational amplifier having two inputs and one output, namely a non-reversing or non inverting input connected to a ground of the circuit; and a reversing or inverting input which receives an input signal via a resistor (or via an element having a resistive characteristic formed by a switched capacitor) and is connected to the output of the operational amplifier via an integrating capacitor. The signal input and the signal output are accomplished with respect to a ground.

FIG. 1 shows one example of an integrator thus realized by the use of an operational amplifier AO having a feedback connection via a capacitor C1, with an input capacitor Co switched by two MOS transistors T1 and T2 in series and operating in phase opposition. The signal input is designated by E and the output is designated by V.

The z-transform of the transfer function of this sampled circuit is written next to the diagram of FIG. 1. T is the switching period of the MOS transistors T1 and T2 (which are switched into conduction in alternate sequence but never simultaneously). This transfer function has a negative coefficient $-CoT/C1$ and a numerator in $z^{-\frac{1}{2}}$. This is in fact a pure integration function but this type of amplifier cannot readily be utilized since it is much too sensitive to stray capacitances.

Another example of integrator which has low sensitivity to stray capacitances is shown in FIG. 2. In this case the input capacitor Co can be connected by means of four MOS transistors T1, T'1, T2, T'2, first between the signal terminal E and ground, then between the input of the operational amplifier and ground but with a reversed sign in order to realize the transfer function indicated next to the diagram of FIG. 2 which is the opposite of the function given in FIG. 1. Here again, this is in fact a pure integration function (as indicated by the presence of the term in $z^{-\frac{1}{2}}$). Unfortunately, the transfer coefficient is positive and there is no means of reversing its sign: the input or output terminals cannot be reversed without short-circuiting the useful signal.

It has therefore been proposed to realize the diagram of FIG. 3 when it is necessary to obtain negative-coefficient integration transfer functions. The transfer function obtained is indicated next to the diagram of FIG. 3. This circuit is practically insensitive to stray capacitances and does in fact realize a negative transfer coefficient. Unfortunately, this is not a pure integrator as shown by the absence of a term in $z^{-\frac{1}{2}}$ at the numerator. Although the diagram of FIG. 3 is very close to that of FIG. 2 since they differ only in the crossing of the switching phases of the input transistors, they cannot be employed for obtaining two pure integral functions having opposite signs.

To these disadvantages of the circuits of FIGS. 1 to 3 can be added the existence of strong interchannel crosstalk when a plurality of filters are placed side by side (when integrated, for example, on a single substrate). This crosstalk arises from common supply sources, from clocks, from transmission of signals through the substrate, and so on.

Finally, when fabricating filters from integrators, it proves useful as a rule to permit the formation of transmission zeros in the transfer function of the filter. Consequently, one object of the present invention is to realize an integrator which, when it is utilized in a filter, readily permits the formation of transmission zeros for obtaining the requisite attenuations in a stop-band with a minimum number of components.

In order to achieve these different objectives, it is proposed according to the present invention to provide a symmetrical integrator comprising an operational amplifier having two floating inputs consisting of a reversing input and a non-reversing input and having two floating outputs, two identical feedback capacitors for connecting respectively each input of the operational amplifier to a respective output, a third capacitor connected via two first insulated-gate transistors respectively to two inputs of the operational amplifier, the first two transistors being turned-on in phase with each other. Two additional insulated-gate transistors are provided and are also turned-on in phase with each other but with one phase which is separate from the phase of the first two transistors. Said two additional transistors serve to connect the third capacitor respectively to two inputs of the symmetrical integrator whose outputs are also the outputs of the operational amplifier.

The symmetrical integrator may be provided with additional pairs of inputs. In this case, these inputs are connected to the inputs of the operational amplifier by means of an arrangement consisting of a capacitor and four insulated-gate transistors, this arrangement being identical with the input arrangement of the first two inputs.

Moreover, and this is one of the main advantages of the invention, the integrator can be provided with at least one other pair of inputs connected via direct-coupling capacitors but without insulated-gate transistors to the two inputs of the operational amplifier.

In a filter which utilizes a symmetrical integrator of this type in accordance with the invention, these direct-coupling capacitors will define by means of their values transmission zeros of the filter transfer function.

Other features of the invention will be more apparent upon consideration of the following description and accompanying drawings, wherein:

FIGS. 1 to 3 described earlier show known integrators;

Figure 1:
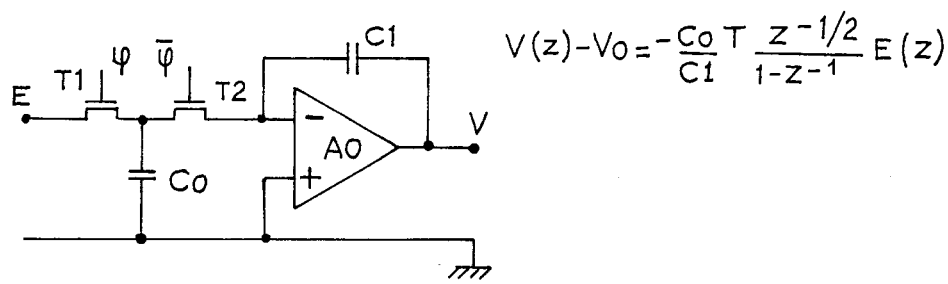
Figure 2:
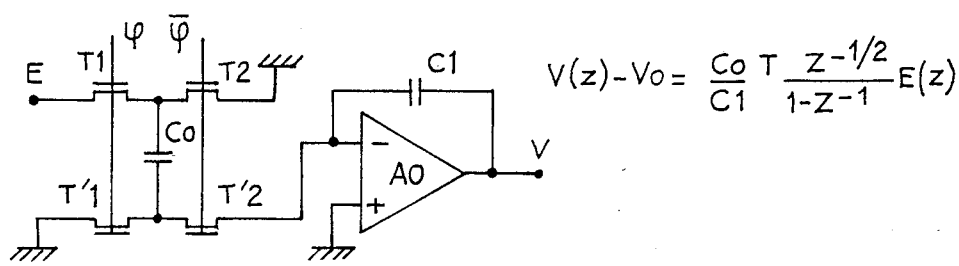
Figure 3:
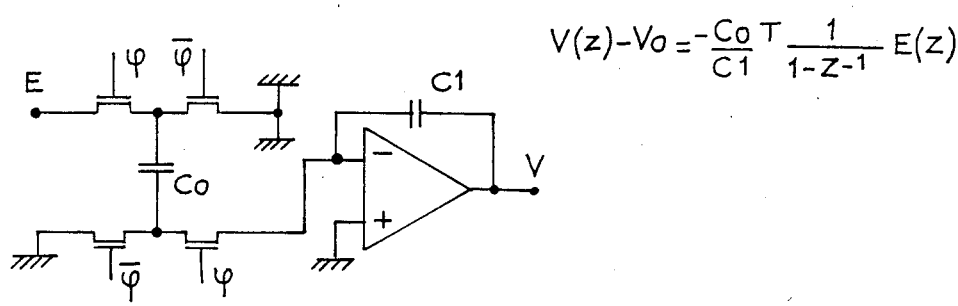
Figure 4:
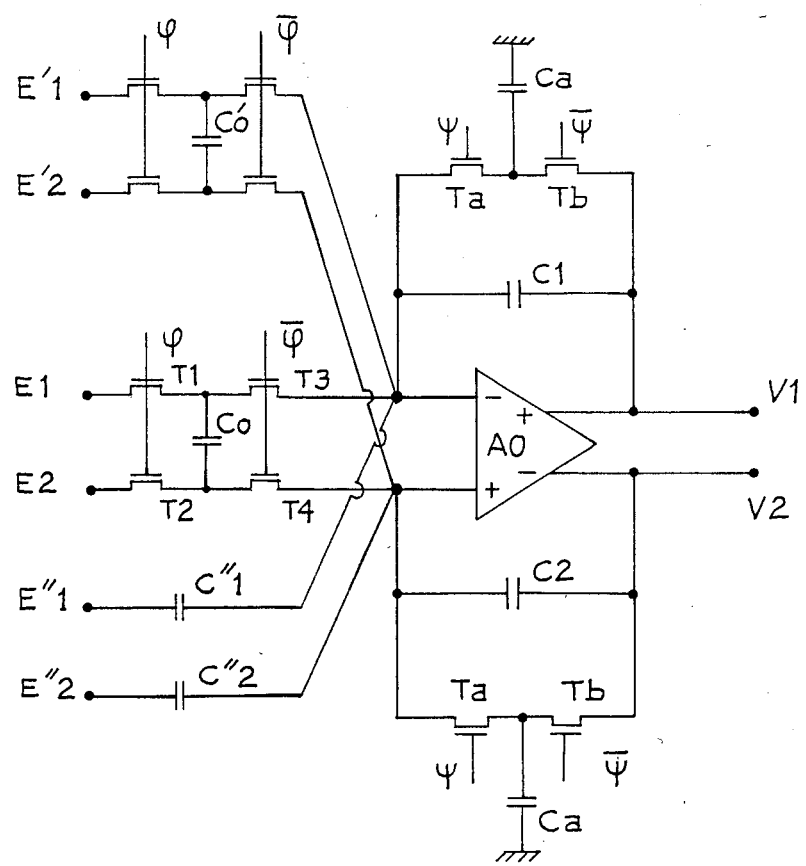
FIG. 4 shows the symmetrical integrator according to the invention.

The symmetrical integrator of FIG. 4 has a number of pairs of inputs designated respectively by the references E1, E2; E'1, E'2; E''1, E''2, and one pair of outputs V1, V2.

Disregarding at this stage all inputs other than the inputs E1 and E2, it is apparent that the integrator comprises an operational amplifier AO having a reversing input indicated by the sign − and a non-reversing input indicated by the sign +. These inputs are of the so-called "floating" type. In other words, neither one input nor the other is connected to a fixed potential such as a ground. Similarly, the two outputs of the operational amplifier which coincide with the outputs V1 and V2 of the integrator are floating outputs.

A feedback capacitor C1 continuously connects the reversing input of the amplifier to the output V1 and another capacitor C2 having the same value connects the non-reversing input to the other output V2.

Between the inputs E1 and E2 of the integrator and the inputs of the amplifier AO, provision has been made for an arrangement consisting of an input capacitor Co and four switching transistors T1, T2, T3, T4 which are insulated-gate transistors fabricated in accordance with an MOS (metal-oxide-semiconductor) technology if the integrator is formed on a semiconductor substrate in accordance with this technology.

The input arrangement is as follows: a first terminal of the capacitor Co is connected on the one hand to the input E1 via the transistor T1 and on the other hand to the reversing input of the amplifier AO via the transistor T3. The other terminal of the capacitor is connected on the one hand to the input E2 via the transistor T2 and on the other hand to the non-reversing input of the amplifier AO via the transistor T4.

The transistors T1 and T2 can be turned-on simultaneously, in which case the capacitor Co is connected between the inputs E1 and E2 or else they can be turned-off simultaneously, in which case said capacitor is isolated from said inputs. Similarly, the transistors T3 and T4 can be turned-on simultaneously, in which case the capacitor Co is connected between the inputs of the operational amplifier or else they can be turned-off simultaneously, in which case said capacitor is isolated from said inputs.

Switching of the transistors takes place cyclically at a fixed frequency.

The conduction phase of the transistors T1 and T2 is separate in all cases from the conduction phase of the transistors T3 and T4, with the result that the inputs E1 and E2 are always isolated from the inputs of the operational amplifier.

If the signal applied between the terminals E1 and E2 is designated as E(z), if the output signal between the terminals V1 and V2 is designated as V(z) and if an initial value of said output signal is designated as Vo, the z-transform of the transfer function of said integrator between the inputs E1 and E2 and the outputs V1 and V2 is written:

$$V(z) - Vo = \frac{-Co}{2Cl} T \frac{z^{-\frac{1}{2}}}{1 - z^{-1}} E(z)$$

This is a pure integral function, the sign of which can be changed by crossing the inputs or the outputs (since the input signal is taken as floating and not fixed with respect to a ground).

There can be added to this function a second similar term derived from two other inputs E'1 and E'2 which would be coupled to the inputs of the operational amplifier by means of an arrangement consisting of one capacitor C'o and four MOS transistors and wholly identical with the arrangement of Co, T1, T2, T3 and T4. It is thus possible to multiply the pairs of inputs and to obtain a sum of integral functions of distinct signals.

Furthermore, it is possible to add to this transfer function a term corresponding to a non-integrated signal. This is achieved, for example, by providing an additional pair of inputs E"1 and E"2 between which the signal to be added is applied. The input E"1 is connected to the reversing input of the amplifier AO via a direct-coupling capacitor C"1 (that is to say a non-switched capacitor). Similarly, the input E"2 is connected to the non-reversing input via a direct-coupling capacitor C"2 having the same value. These direct-coupling capacitors are those which make it possible to form transmission zeros in a filter which utilizes this symmetrical integrator.

The integrator according to the invention is preferably provided in addition with means which compensate for the offset voltage of the operational amplifier. These means can consist of an element having a resistive characteristic of high value in parallel with each feedback capacitor C1 and C2. In the example shown in FIG. 4, this element is constituted by a switched capacitor Ca connected on one side to ground and on the other side both to one terminal of the feedback capacitor C1 (or C2) via a transistor Ta and to the other terminal of said capacitor via another transistor Tb. The transistors Ta and Tb are switched alternately (separate conduction phases) at a frequency which is much lower than the switching frequency of the input transistors of the integrator.

Figure 5:
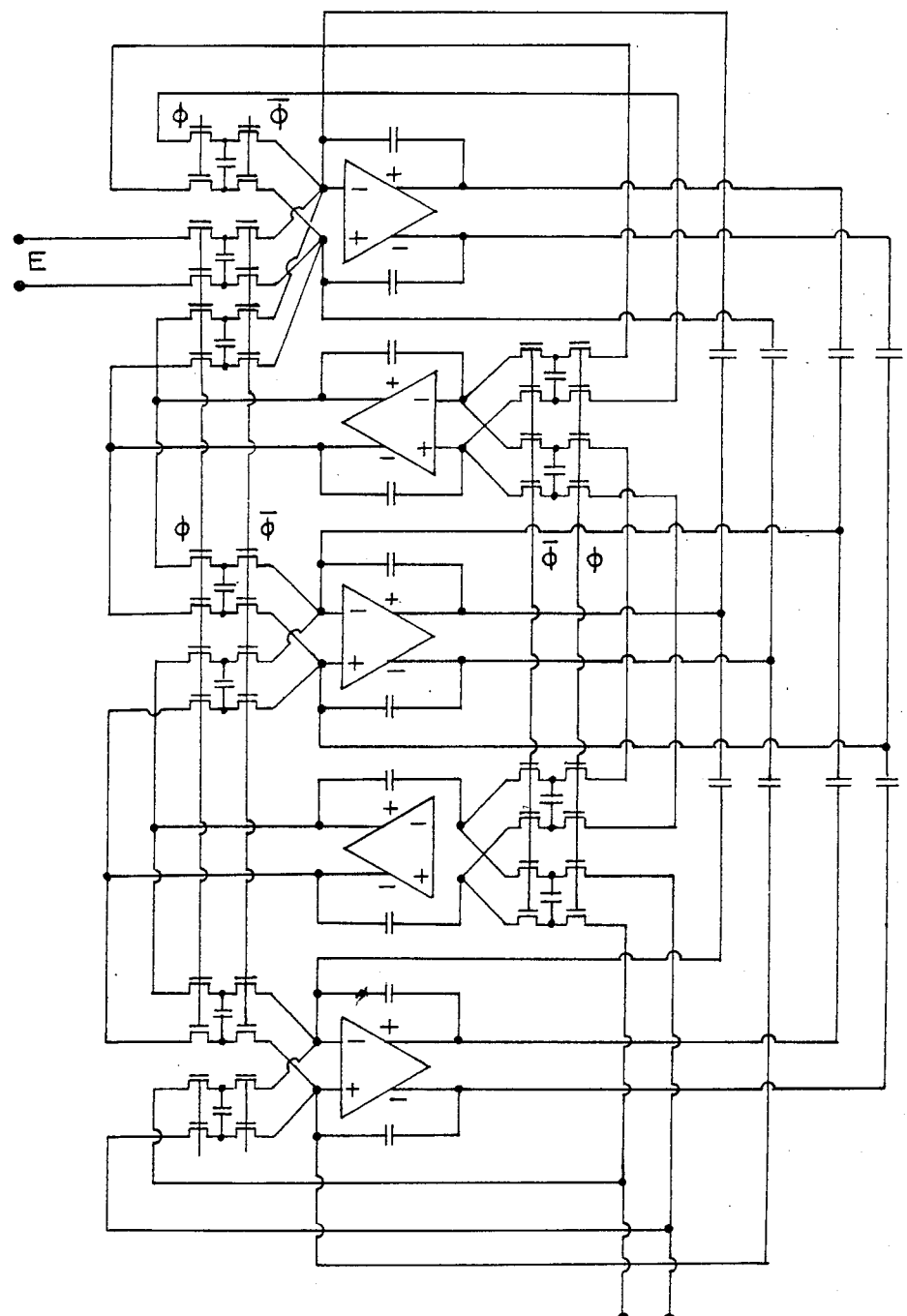
FIG. 5 shows one example of a filter according to the invention and constructed by making use of symmetrical integrators of the type shown in FIG. 4.

FIG. 5 is a diagram illustrating the filter according to the invention which utilizes five symmetrical integrators of the type shown in FIG. 4 (the elements for compensating the offset voltage have not been shown).

Each integrator receives differential input signals via switched capacitors or via direct-coupling capacitors, these signals being derived from the differential outputs of the different integrators. The filter shown in the drawings has a transfer function of the fifth order with transmission zeros and thus realizes the equivalent of a purely reactive low-pass filter having two rejector circuits in series.

In all the FIGS. 1 to 5, there have not been shown the periodic-switching control means which are necessary for turning on or off the input transistors of the integrator or the transistors of the offset compensation circuit.

What is claimed is:

1. A symmetrical integrator for use in a switched capacitor filter, comprising an operational amplifier having two floating inputs of which one being an inverting input and the other being a non-inverting input and two floating outputs; two identical feedback capacitors, each connected between an input and a respective output of the operational amplifier; a third capacitor having one terminal connected by a first insulated gate transistor to a first input of the integrator, and having a second terminal connected by a second insulated gate transistor to a second input of the integrator, said one terminal being connected through a third transistor insulated gate to said inverting input of the operational amplifier and said second terminal being connected through a fourth insulated gate transistor to said non inverting input, said floating outputs of the operational amplifier being the outputs of the integrator, and means for periodically turning-on simultaneously said first and second insulated gate transistors while said third and fourth insulated gate transistors are non-conducting and for turning-on simultaneously said third and fourth insulated gate transistors while said first and second insulated gate transistors are non-conducting.

2. A symmetrical integrator according to claim 1, wherein said integrator is provided with at least one additional pair of inputs connected to the inputs of the operational amplifier by means of an arrangement which consists of one capacitor and four insulated gate transistors actuated in phase and in pairs and which is identical to the input arrangement of said first and second inputs.

3. A symmetrical integrator according to claim 1 or claim 2, wherein said integrator has at least one pair of inputs connected via non-switched capacitors to the two inputs of the operational amplifier.

4. A symmetrical integrator according to claim 1 or claim 2, wherein an element for compensating the offset voltage having a resistive characteristic is placed in parallel with each of the two feedback capacitors.

5. A symmetrical integrator according to claim 4, wherein the element having a resistive characteristic is constructed by making use of a capacitor switched by two insulated-gate transistors which are turned-on in alternate sequence.

* * * * *